United States Patent [19]
Wood

[11] Patent Number: 5,694,124
[45] Date of Patent: Dec. 2, 1997

[54] PORTABLE COMPUTER WITH INTEGRATED CIRCUIT BOARD AND KEYBOARD

[75] Inventor: Anthony B. Wood, Dallas, Tex.

[73] Assignee: Texas Instruments Incorporated, Dallas, Tex.

[21] Appl. No.: 594,216

[22] Filed: Jan. 31, 1996

[51] Int. Cl.[6] ................................................ H03K 17/94
[52] U.S. Cl. ......................... 341/22; 200/292; 200/345; 400/495; 361/680
[58] Field of Search ........................... 341/22, 27, 31, 341/32, 33, 34; 364/708.1, 709.01, 709.12; 345/168, 169; 400/479, 479.1, 479.2, 490, 495; 200/5 A, 292, 345; 361/680

[56] References Cited

U.S. PATENT DOCUMENTS

| | | | |
|---|---|---|---|
| 4,647,729 | 3/1987 | Collar et al. | 200/292 |
| 5,145,058 | 9/1992 | Lee | 200/292 |
| 5,164,553 | 11/1992 | Kitahara et al. | 200/5 A |
| 5,401,929 | 3/1995 | Chen | 200/534 |
| 5,456,541 | 10/1995 | Ching-Shui | 200/5 A |
| 5,461,376 | 10/1995 | Oono et al. | 341/22 |
| 5,532,904 | 7/1996 | Sellers | 200/345 |

*Primary Examiner*—Jeffery Hofsass
*Assistant Examiner*—Andrew Hill
*Attorney, Agent, or Firm*—Bret J. Petersen; James C. Kesterson; Richard L. Donaldson

[57] ABSTRACT

A portable computer (40) has an integrated motherboard/keyboard/housing assembly (48) wherein the keys (50) are disposed through the motherboard (54) to contact a keyboard circuit (56) on the upper surface of the bottom layer of the main housing (44). During a keystroke, the key travels within a hole (52) in the motherboard (54), which also acts as a guide to the key. Accordingly, weight and height associated with separate assemblies is greatly reduced.

24 Claims, 5 Drawing Sheets

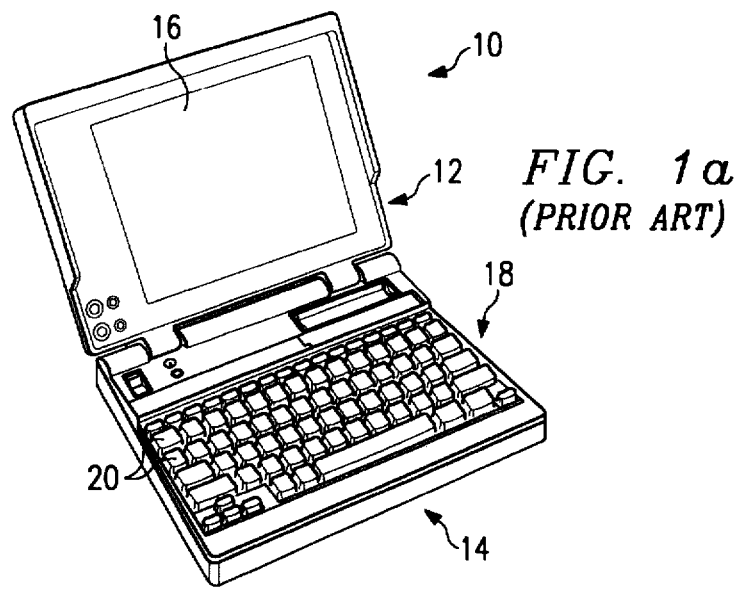
FIG. 1a
(PRIOR ART)
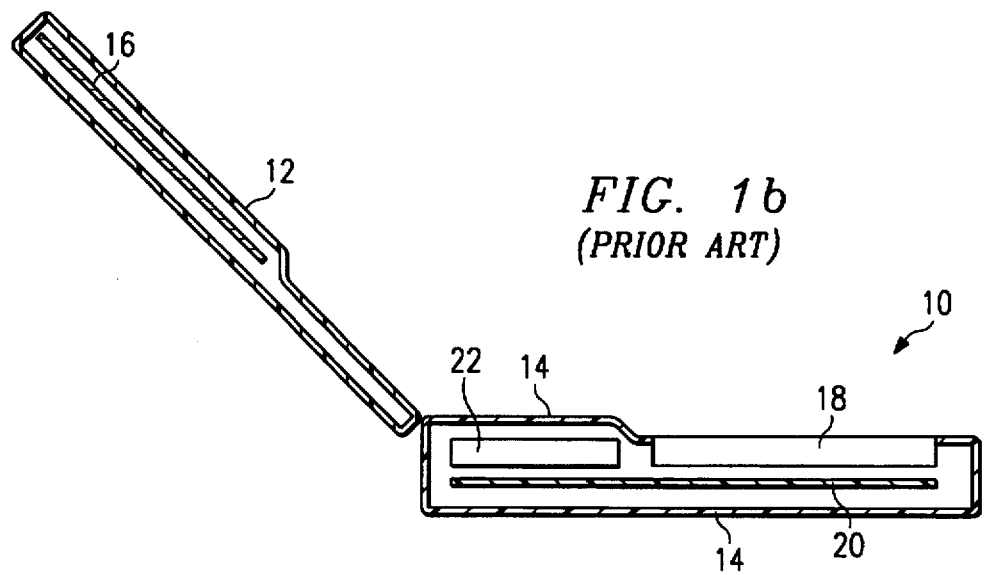
FIG. 1b
(PRIOR ART)
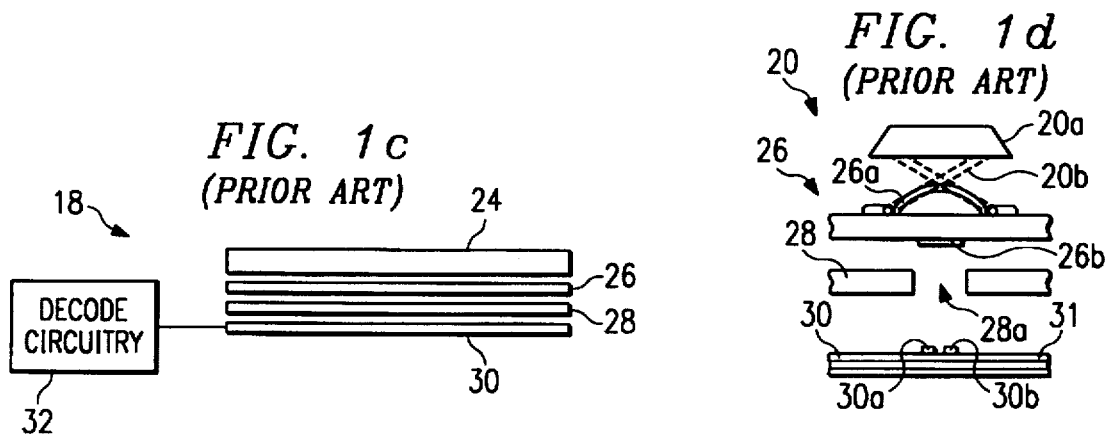
FIG. 1c
(PRIOR ART)
FIG. 1d
(PRIOR ART)

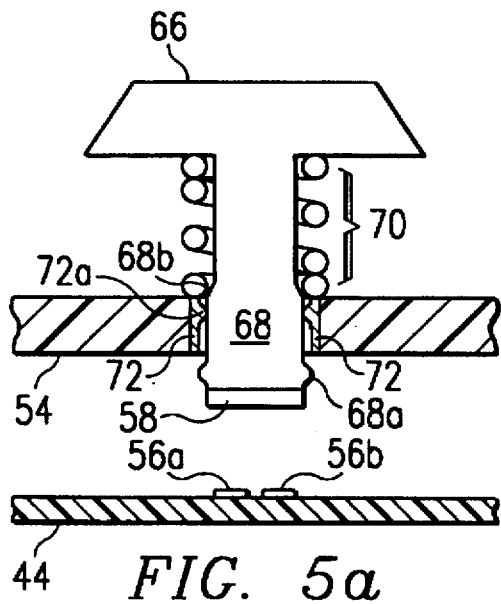
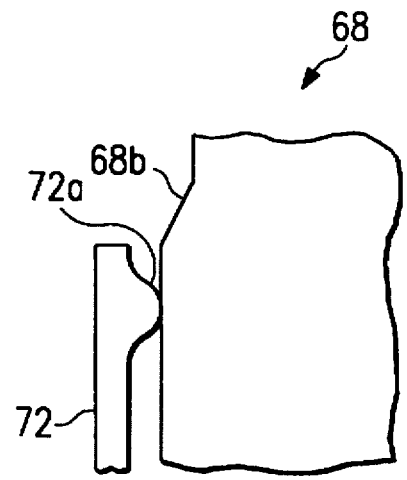
FIG. 5a    FIG. 5b
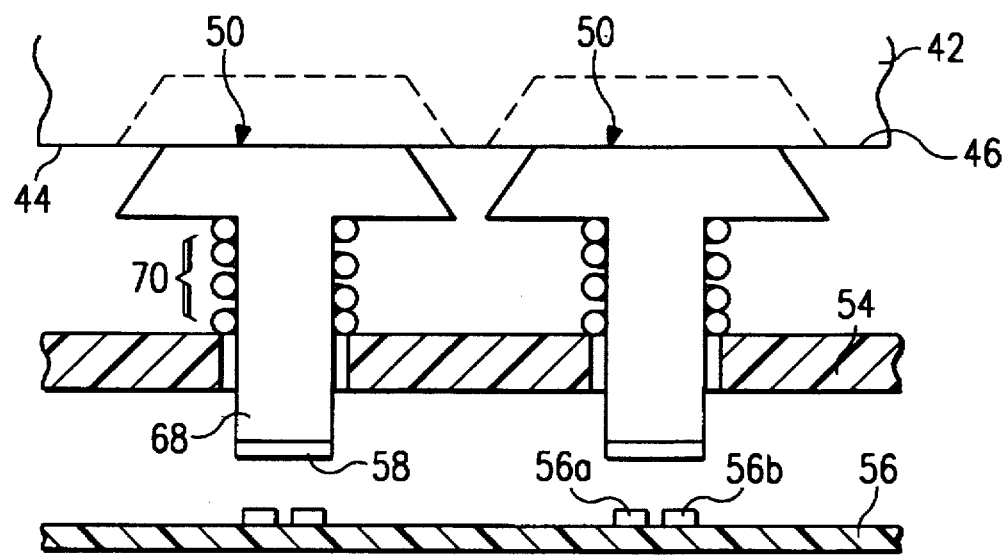
FIG. 8

PORTABLE COMPUTER WITH INTEGRATED CIRCUIT BOARD AND KEYBOARD

BACKGROUND OF THE INVENTION

1. Technical Field

This invention relates in general to computers and, more particularly, to portable computers.

2. Description of the Prior Art

Since the proliferation of the personal computer as a personal and business tool, portable computers have been in high demand. Portable computer manufacturers are continually refining the portable computers to have a greater number of features while reducing the size and weight of the units.

Very low weight portable computers are referred to as "notebook" computers. At one time, notebook computers were stripped of many features in order to reduce weight and size; however current day notebook computers are full-featured, including one or more mass storage devices such as floppy drives, optical disks, such as CD-ROMs (compact disk read-only memories), and hard drives. Future notebook computers may offer an even wider variety of drives with future technologies such as DVD (digital video disks) on the horizon and the greater acceptance of high density removable medium drives such as magneto-optical drives.

It is particularly desirable to reduce the size of a computer without reducing its functionality. A typical notebook computer has its components integrated into a durable plastic housing. The main housing contains the keyboard, data drives and the computer circuitry, often referred to as the motherboard. A display, typically a LCD (liquid crystal display) is mounted in a display housing which is connected to the main housing such that the display housing may be folded onto the main housing while the computer is not being used. Some computers integrate the display into the main housing such that it is adjacent to the keyboard.

The thickness of the computer in the main housing is thus dependent upon the thickness of the keyboard unit, the thickness of the motherboard, and by the spacing between the keyboard unit and the motherboard necessary to dissipate the heat generated by the keyboard during use. While efforts have been made to reduce the thickness of the keyboard, many such attempts reduce the distance traveled by a key during a keystroke. The change in the feel of a keystroke is annoying to many users who are used to touch typing.

The weight of the computer is dictated by the weight of the various components in the computer. In order to decrease weight, efforts have been made to reduce the weight of each of the individual components, either by reducing the size of the components or by switching to lighter materials. Despite these efforts, the weight of current day notebooks is considered to be too high.

Accordingly, a need exists for reducing the thickness and weight of a portable computer without adversely affecting the functionality or durability of the computer.

SUMMARY OF THE INVENTION

In the present invention, a computer comprises a circuit board containing processing circuitry and having a plurality of holes formed therein, through which a plurality of keys are disposed. The keys move within said holes during a keystroke.

The present invention provides significant advantages over the prior art. First, the overall height of the computer can be greatly reduced. In prior art portable computers, the keyboard is contained in a module separate from other assemblies in the portable computer. Thus, the height of the keyboard is cumulative to the height needed for the other assemblies which lie below the keyboard in the portable computer. By integrating the keyboard and motherboard, the height is greatly reduced. Greater increases in height reduction can be achieved by using the upper surface of the bottom of the housing as a substrate for the keyboard.

Further, the assembly reduces the weight of a portable computer, since the motherboard provides the structure for guiding the keys to minimize wobble during a keystroke, thereby eliminating structures found in current day keyboards.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a is a perspective view of a prior art notebook computer;

FIG. 1b is a cross-sectional view of a prior art notebook computer;

FIG. 1c is a partially cross-sectional, partially schematic view of a prior art keyboard module;

FIG. 1d is a detailed cross sectional view of a key in a prior art keyboard assembly;

FIGS. 5a and 5b are detailed cross-sectional diagrams of a key used in the integrated motherboard/keyboard/housing assembly;

FIG. 8 is a cross-sectional diagram of the integrated motherboard/keyboard/housing assembly in a closed state.

DETAILED DESCRIPTION OF THE PREFERRED EMBODIMENT

Figure 2:
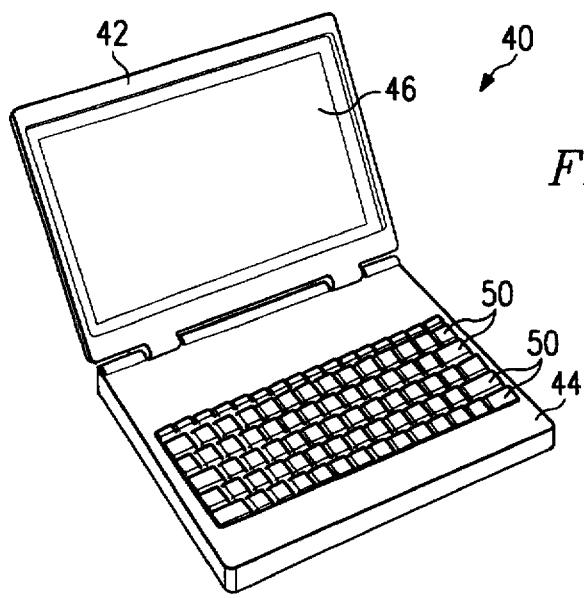
FIG. 2 is a perspective view of a notebook computer incorporating the present invention.

The present invention is best understood in relation to FIGS. 1–8 of the drawings, like numerals being used for like elements of the various drawings.

FIGS. 1a–b illustrate a perspective and cross-sectional views of an exemplary prior art notebook computer 10. It should be noted that there a presently a large number of notebook designs, both in function and appearance, and FIGS. 1a–b are meant only to show general designs, not an actual design by any particular manufacturer.

Notebook computer 10 has two housings, the display housing 12 and the main housing 14. Inside the display housing 12 is a display 16, typically a LCD display. Main housing 14 contains the keyboard module 18, having exposed keys 20, one or more circuit boards (hereinafter the "motherboard" 20) the power source (typically a battery, not shown) and data drives 22, which may include, for example, any combination of floppy disk drives, CD-ROM drives, and hard disk drives.

Display housing 12 is coupled to main housing 14 by hinges. When inactive, the display housing 12 is folded over the main housing 14 for easy portability.

In order to reduce the size and weight of a notebook computer, manufacturers are constantly trying to minimize the size of various components. However, many of the components have requirements which prevent further miniaturization. For example, the thickness and weight of the keyboard module 18 is in part dictated by user preferences for the keys to move a certain distance during touch typing. An optimum distance for a keystroke is approximately three to four millimeters. While a keyboard module with no keystroke movement would reduce the thickness and weight of the keyboard module 18, such keyboards have been rejected by users in favor of notebook computers with keyboards having characteristics similar to desktop computer keyboards.

A cross-sectional diagram of a typical prior art keyboard module 18 is shown in FIGS. 1c and 1d. Four functional layers are used in the keyboard. The top layer is the key layer 24 which provides the keys 20, each of which include a cap 20a and an associated mechanism 20b (shown in phantom) for providing smooth up and down movement of the key cap 20a. A membrane layer 26 resides below the key layer 24. The membrane layer typically includes a resilient device below each key 20 to provide a tactile response when the associated key is pressed. One typical resilient device is a neoprene cup 26a, such as shown in FIG. 1d, which collapses when a key is pressed and restores the key to its normal position when the key is released.

The membrane layer 26 also includes a contact 26b corresponding to each key 20. As the key 20 is depressed, the contact 26b is pushed through a hole 28a in spacer layer 28 to come into physical contact with first and second terminals 30a and 30b of keyboard circuit layer 30, causing a short between first and second terminals 30a and 30b. The keyboard circuit layer includes conductive paths, typically arranged in rows and columns, coupled to the first and second conductive terminals 30a and 30b, such that each key is associated with a unique set of conductive paths. The short between a pair of conductive terminals is detected by decode circuitry 32, which is coupled to the conductive paths. The decode circuitry 32 identifies which key was pressed in response to the particular conductive paths involved in the short. A scan code identifying the pressed key is sent to the motherboard 20 by the decode circuitry 32.

It should be noted that there are other designs for creating a conductive path responsive to a keystroke which are commonly used in keyboard designs. For example a portion of the conductive paths (the row paths) can be formed on the membrane layer 26, terminating on contacts 26b. The column paths can be formed on the keyboard circuit layer. When a contact 26a is pressed against the keyboard layer, a row path is electrically coupled to a column path and the responsible key can be detected.

The keyboard circuit layer 30 typically is formed on a flexible printed wiring board (PWB). A rigid substrate 31 is disposed below the keyboard circuit layer to provide a sturdy surface for reliable contact between the contact 26b and the terminals 30a and 30b. This substrate 31 also adds additional weight to the notebook computer 10.

FIG. 2 illustrates a perspective view of a preferred embodiment of a notebook computer 40 according to the present invention. As in FIG. 1a, the computer 40 includes a display housing 42 and a main housing 44 surrounding keys 50. The display housing 42 includes a display 46. The main housing includes the keyboard circuitry and motherboard, along with other devices, such as data drives and input output ports. The keyboard and motherboard are shown in greater detail in connection with FIG. 3.

The notebook computer 40 integrates the keyboard and motherboard such that the motherboard is used for structural support for the individual keys, thereby reducing the amount of keyboard structure. Further, the height attributable to the keyboard and the height attributable to the motherboard are not cumulative. This aspect is shown in greater detail in connection with FIG. 3.

Figure 3:
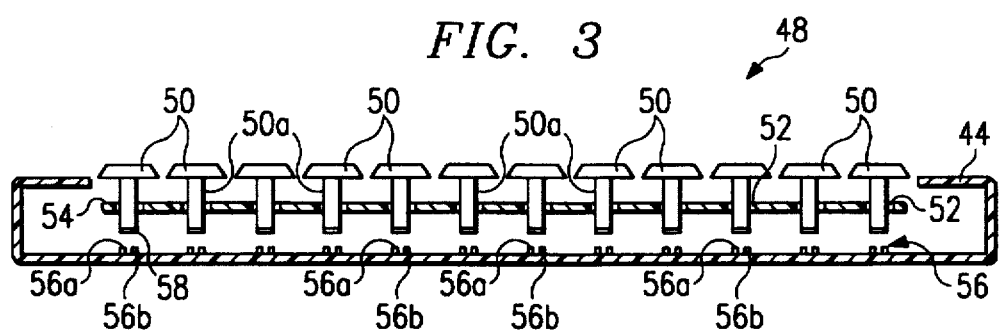
FIG. 3 is a cross-sectional view of an integrated motherboard/keyboard/housing assembly used in the notebook computer of FIG. 2.

FIG. 3 shows a simplified cross-sectional view of a preferred embodiment of a notebook computer having an integrated motherboard/keyboard/housing assembly 48. The keys 50, shown in greater detail in connection with FIGS. 5a–b and 6a–e have stems 50a disposed in respective holes 52 formed in the motherboard 54. The keyboard circuit layer 56, including respective terminals 56a and 56b is formed on the upper (inside) surface of the bottom of the main housing. Contacts 58 are formed on the bottom of keys 50.

In operation, as a key is pressed, the stem 50a of the key is guided by the respective hole 52 of the motherboard 54. The motherboard 54 provides a guiding mechanism which reduces any excessive lateral wobble of the keys during a keystroke. A full 4 mm keystroke can be obtained so long as the distance from the contact 58 is 4 mm from the upper surface of the bottom of the main housing 44 (i.e., the keyboard circuit layer 56).

In the preferred embodiment, the keyboard circuit 56 is deposited on the upper surface of the bottom of the main housing 44. Alternatively, the keyboard circuit 56 may be formed on a thin flexible PWB which overlies the upper surface of the bottom of the main housing 44.

The embodiment shown in FIG. 3 provides significant advantages over the prior art. Since the keys move through motherboard 54, the height of the notebook attributable to the keyboard is reduced, since the space for the keyboard overlaps the space for the motherboard. Further, the weight attributable to the mechanism 20b for guiding the keys 50 during a keystroke is eliminated, since this function is performed using the motherboard as support. The weight of the keyboard circuit layer 30 and spacer layer 28 are also greatly reduced.

By placing the keyboard circuit 56 on the upper surface of the bottom of the housing 44, or by using the upper surface of the bottom of the housing as a rigid substrate for the keyboard circuit layer, the weight associated with the keyboard circuit layer can be greatly reduced, as well as the height associated with this layer. It should be noted, however, that substantial height and weight improvements can be made even if the upper surface of the bottom of the main housing 44 is not used as the substrate for the keyboard circuit layer 56, because of the gains attributable to integrating the motherboard 54 with the keyboard.

Figure 4:
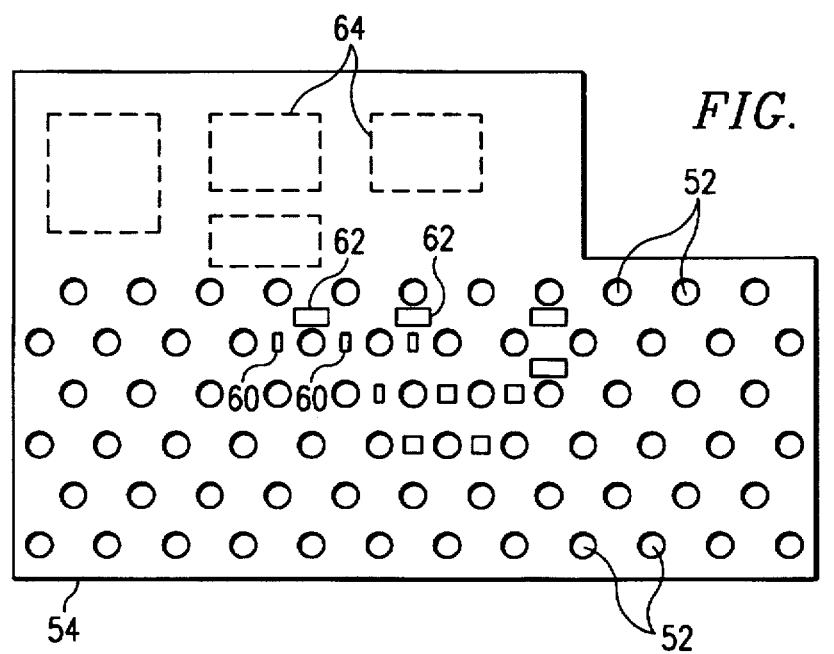
FIG. 4 is a top view of the motherboard used in the motherboard/keyboard/housing assembly of FIG. 3.

FIG. 4 shows a top view of the motherboard 54. The holes 52 are placed in the area below the keys 50. Between holes, discrete circuitry 60 and small integrated circuits 62 can be placed, on both the top and bottom surfaces of the motherboard 54. The larger integrated circuits 64, such as the microprocessor, chipset, and graphics controller, can be placed on the portion of the motherboard above the keys, on both sides of the motherboard 54.

FIGS. 5a and 5b show a more detailed cross-sectional view of a preferred embodiment of the motherboard/keyboard/housing assembly 48 for a single key 50. The key 50 includes a cap 66 and a stem 68 which extends downward from the cap 66. Contact 58 is coupled to the end of stem 66. A spring 70 (alternatives to a coiled wire spring are shown in connection with FIGS. 6a–e) is disposed around the upper end of stem 68, between cap 66 and the motherboard 54. A guide 72 is placed in holes 52 formed in the motherboard to provide a smooth surface.

Stem 68 has an annular ridge 68a formed at the bottom of the stem. The annular ridge 68a increases the circumference of the stem below the motherboard 54 and guide 72 to prevent the key from rising above a predetermined level under the force of spring 70. The ridge is small enough to allow insertion of the stem through guide 72 during assembly of the keyboard.

A inner annular ridge 72a is formed on the inside of guide 72 to provide a higher resistance to movement of the stem during the first part of a keystroke. Once the stem has traveled a predetermined distance, the stem narrows slightly in diameter at point 68b to release the resistance, thereby providing a tactile response indicative of a complete keystroke. At this point, contact 58 shorts terminals 56a and 56b, providing a scan code to be sent to the processing circuitry as described above. It should be noted that many other mechanisms exist for providing a tactile response; the mechanisms could be used with the present invention, as would be known to one skilled in the art.

FIGS. 6a–e illustrate alternative embodiments of the motherboard/keyboard/housing assembly 48, specifically describing alternative embodiments for keys 50.

Figure 6A:
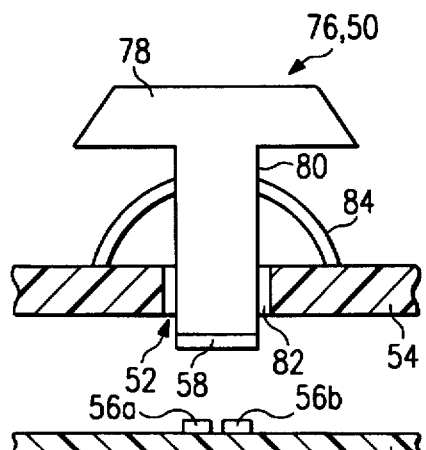
FIGS. 6a–6f are detailed cross-sectional diagrams of alternative embodiments for keys used in the integrated motherboard/keyboard/housing assembly.

In FIG. 6a, a key 76 has a cap 78 and a stem 80, which is disposed through a hole 52 in motherboard 54. Contact 58 is attached to the bottom of stem 80. Guide 82 provides a smooth surface for movement of the stem within hole 52. A resilient cup 84, such as a neoprene cup of a type commonly used in computer keyboards, is disposed between cap 78 and stem 80.

In operation, a downward keystroke will cause the resilient cup 84 to collapse. The cup's collapse results in a distinct tactile response felt by the user. Further, upon releasing the key 76, the cup will return to its original position. Hence, the resilient cup 84 acts as both the spring and the mechanism for providing a tactile response.

Figure 6B:
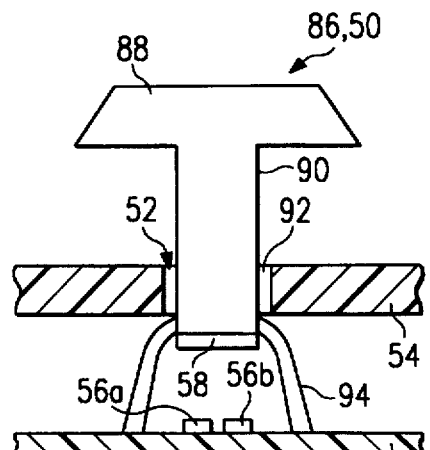

FIG. 6b illustrates a second alternative embodiment for a key used in the motherboard/keyboard/housing assembly 48. Key 86 has a cap 88 and a stem 90, which is disposed through a hole 52 in motherboard 54. Contact 58 is attached to the bottom of stem 90. Guide 92 provides a smooth surface for movement of the stem within hole 52. A resilient cup 94, such as a neoprene cup of a type commonly used in computer keyboards, is disposed between the bottom of stem 90 and the keyboard circuit layer 56.

The embodiment shown in FIG. 6b is similar to the embodiment shown in FIG. 6a, with the exception that the resilient cup 94 is disposed at the bottom of the stem 90, rather than at the top of the stem. The operation of the embodiment of FIG. 6b is also similar to that of FIG. 6a; upon a downward keystroke, the resilient cup 94 collapses, causing a tactile response to the user. Further, the cup 94 acts as a spring to return the key to its normal position.

Figure 6C:
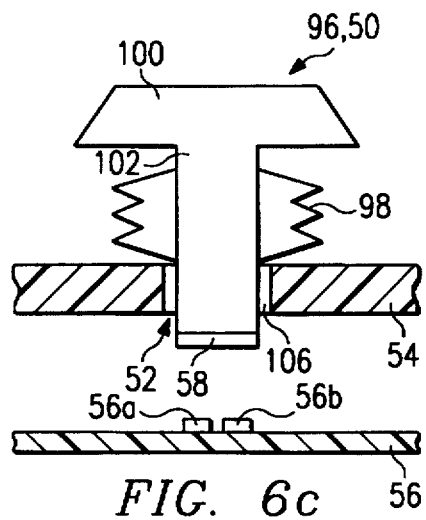

FIG. 6c illustrates an embodiment for a key 96 used in the motherboard/keyboard/housing assembly 48, where an accordion shaped spring 98 is disposed between the cap 100 of the key 96 and the motherboard 54. A stem 102 protrudes from the cap 100 through the hole 52 in the motherboard 54, and terminates in contact 58. As in FIG. 5a, the stem may be contoured to provide a tactile feel in conjunction with an inner annular ridge of guide 106; other mechanisms for providing a tactile response could be used in place of this particular mechanism.

Figure 6D:
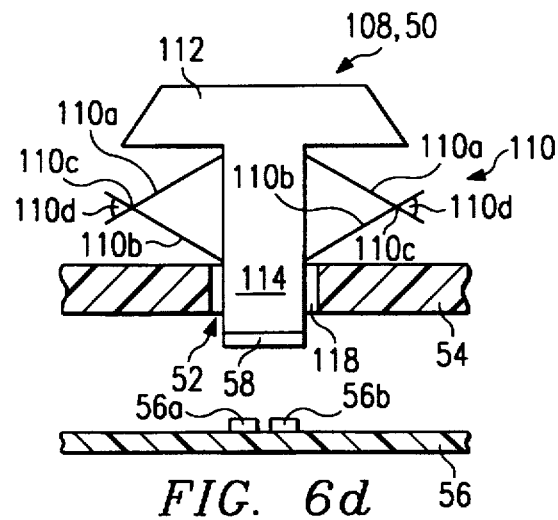

FIG. 6d illustrates an embodiment for a key 108 used in the motherboard/keyboard/housing assembly 48, where an cantilever spring 110 is disposed between the cap 112 of the key 108 and the motherboard 54. Cantilever spring 110 has first arms 110a jointed with second arms 110b at joint 110c. A resilient material 110d is place at the joint such that the spring returns to a predetermined position after a keystroke. A stem 114 protrudes from the cap 112 through the hole 52 in the motherboard 54, and terminates in contact 58. As in FIG. 5a, the stem could be contoured to provide a tactile feel in conjunction with an inner annular ridge of guide 118 or another mechanism could be used to provide a tactile response.

Figure 6E:
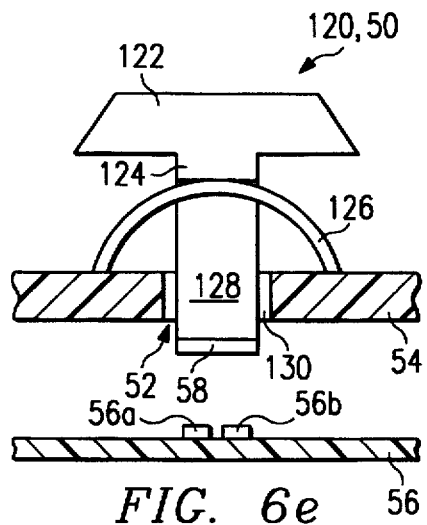

FIG. 6e illustrates an embodiment for a key 120 similar to that shown in connection with FIG. 6a. Key 120 has a cap 122 and a stem 124. Resilient cup 126, which may be, for example, a neoprene cup, is disposed between cap 122 and motherboard 54. A second stem 128 protrudes downwardly through hole 52 in motherboard 54. Contact 58 is attached to the bottom of second stem 128. Guide 130 provides a smooth surface for movement of the stem within hole 52.

The operation of embodiment differs from that shown in FIG. 6a, in that the key 120 presses down on cup 126 and, when cup 126 collapses, second stem 128 is pressed downward through hole 52, resulting in contact with terminals 56a and 56b.

Figure 6F:
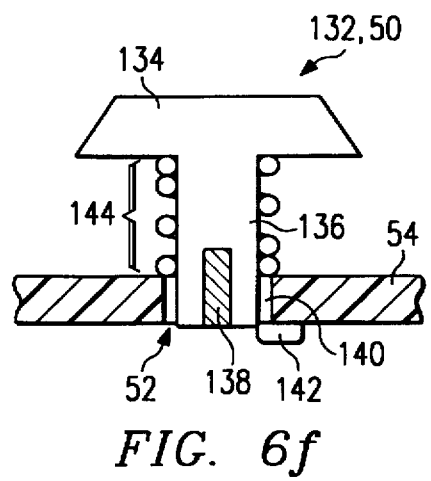

FIG. 6f illustrates an embodiment of a key 132 which uses the Hall effect for keystroke detection. Key 132 has a cap 134 and a stem 136, which contains a magnet 138. Guide 140 provides a smooth surface for movement of the stem 136 within hole 52. A Hall effect sensor 142 is located below motherboard 54. Spring 144 is positioned between key 132 and motherboard 54.

In operation, magnet 138 moves past sensor 142 during a keystroke, causing a moving magnetic field which is detected by Hall effect sensor 142. Upon detection of the moving magnetic field, Hall effect sensor 142 generates a signal which is received by decode circuitry 32.

While the sensor 142 is shown as located below motherboard 54, is could also be located above the motherboard or incorporated into guide 140.

Figure 7A:
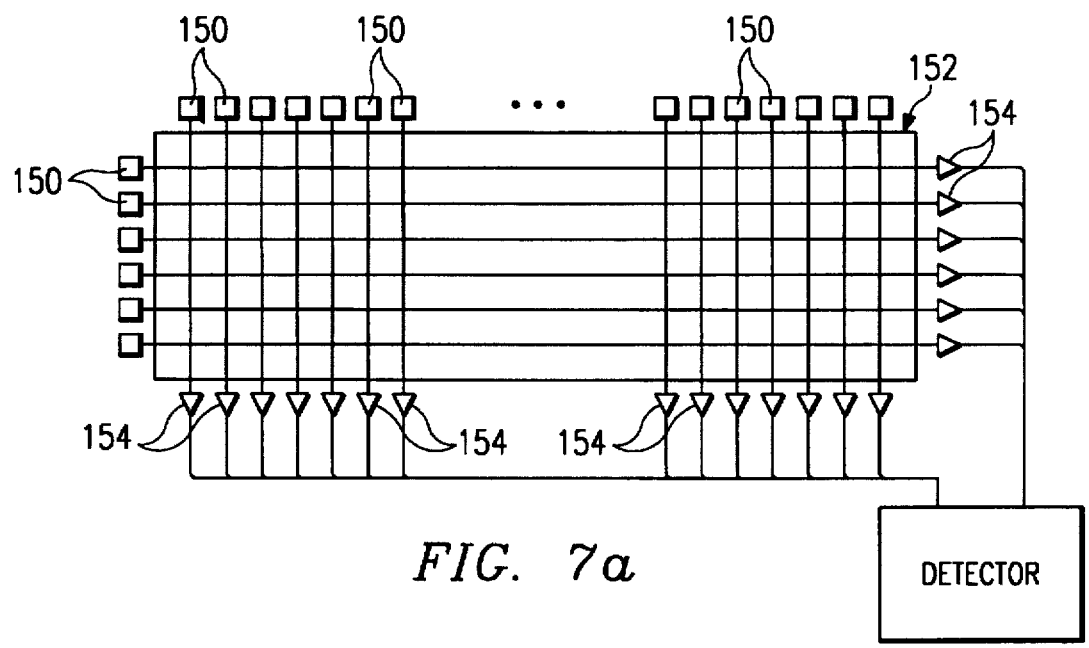
FIG. 7a is a schematic view of a first embodiment of an optical keystroke detection circuit.

FIG. 7a illustrates an embodiment for providing an optical detection of a keystroke. LED's 150 (light emitting diodes) provide beams of light in a plurality of rows and columns which intersect at points in an area 152 where stems of a key will protrude during a keystroke. Each key is associated with a unique row and column. Detectors 154 are placed across the area 152 to receive the light from a respective LED 150. During a keystroke, the light associated with a row and a column will be interrupted; a decoder circuit 156 can detect the key associated with the keystroke and sent the appropriate scan code to the motherboard 54.

Figure 7B:
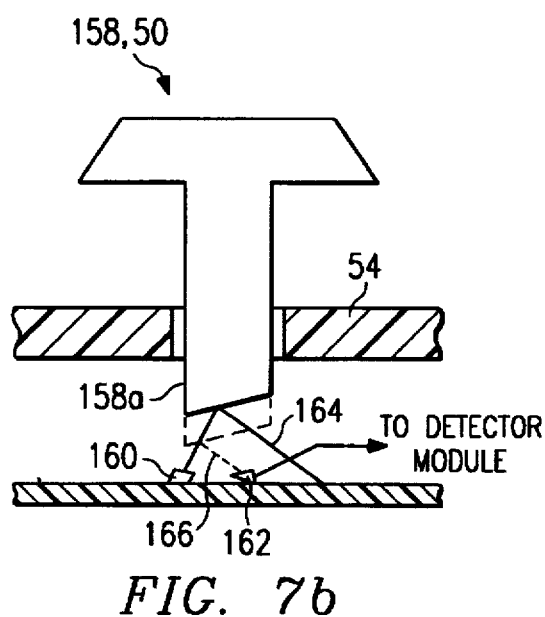
FIG. 7b is a partially cross section, partially schematic view of a second embodiment of an optical keystroke detection circuit.

FIG. 7b illustrates an embodiment of an optical detection circuit where each key 158 has an associated LED 160 and optical fiber 162. When the key is in its normal position, the bottom of the stem 158a deflects light away from the associated optical fiber as shown by line 164. During a keystroke, the light is deflected towards the optical fiber 162 as shown by dashed line 166. In the preferred embodiment, the fibers 162 for each key are coupled to a common detector circuit 32, which scans the fibers continuously. When light is detected on a fiber, the appropriate scan code is output to the motherboard.

Figure 7C:
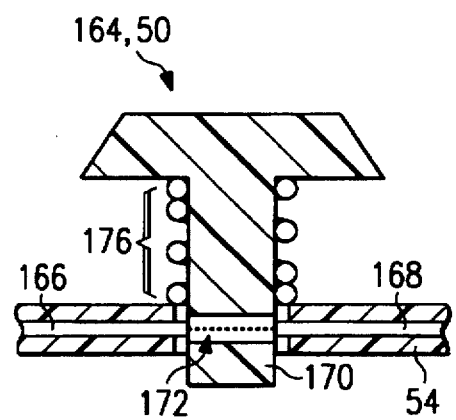
FIG. 7c is a cross sectional view of a third embodiment of an optical keystroke detection circuit.

FIG. 7c illustrates an embodiment of an optical detection circuit where each key 164 is operable to pass or block light from a first optical fiber 166 to a second optical fiber 168. As shown in FIG. 7c, the stem 170 of each key 164 has a hole 172 through which light can pass from the first optical fiber 166 to the second optical fiber 168 at the bottom of a keystroke. A resilient member 176 returns the key to its upright position. The first and second fibers associated with each key are coupled to the decode circuitry 32.

In operation, the first optical fibers and the second optical fibers can be arranged as shown in FIG. 7a. For example, the first optical fibers could be arranged in rows and the second optical fibers could be arranged in columns. The decode circuitry 32 generates a light on one of said first fibers and scans the second fibers to see if the light returns. If so, a scan code is sent to the motherboard. The decode circuitry continually steps though each of the first fibers and detecting light through one of the second fibers in this fashion.

Although the embodiment of FIG. 7c is shown as passing light in response to a keystroke, it would be equally possible to pass light while a key is not pressed down and block light as the stem is pushed downward. In this embodiment, the decode circuitry 32 would generate a light on one of the first optical fibers and detect the lack of light in a second optical fiber during a keystroke.

It should be noted that many other optical detection circuits could also be used, as would be clear to one skilled in the art.

FIG. 8 illustrates an embodiment of the motherboard/ keyboard/housing assembly 48 while the notebook computer 40 is in an inactive state, i.e., with the display housing 42 folded against the main housing 44. During an active state, i.e. with the display housing 42 folded away from main housing 44, the keys the keys 50 protrude upwardly from the surface of the main housing(as drawn in phantom in FIG. 8). As shown in FIG. 8, when the notebook computer 40 is in an inactive state, the keys 50 may be pressed downward by the display housing 42 and the display 44, such that the tops of the keys are in a position between the normal active position and the bottom of the keystroke position. In the preferred embodiment, the contact 58 does not touch the terminals 56a–b of the keyboard circuit 56 while in an inactive state (if such terminals are used), since prolonged contact may wear away the material forming contact 58 or the terminals 56a–b.

As demonstrated in FIG. 8, designing the display housing 42 and main housing 44 to push the keys 50 downward when the notebook computer 40 is closed, results in a recovery of the height attributable to the portion of the keys which lies above upper plane of the main housing.

When the notebook computer is in a stored position, however, the resilient member will be partially compressed. While any of the embodiments shown in FIGS. 5a–b and 6a–e can be used while partially compressed, the resilient member must be designed such that resilient member will not be damaged by long term storage in a partially compressed state.

The present invention provides significant advantages over the prior art. First, the overall height of the computer can be greatly reduced. In prior art portable computers, the keyboard is contained in a module separate from other assemblies in the portable computer. Thus, the height of the keyboard is cumulative to the height needed for the other assemblies which lie below the keyboard in the portable computer. By integrating the keyboard and motherboard, the height is greatly reduced. Greater increases in height reduction can be achieved by using the upper surface of the bottom of the housing as a substrate for the keyboard.

Further, the assembly reduces the weight of a portable computer, since the motherboard provides the structure for guiding the keys to minimize wobble during a keystroke, thereby eliminating structures found in current day keyboards.

As would be known to one skilled in the art, various modifications to the illustrated embodiments could be made without affecting the benefits of the invention. For example, in addition to the embodiments shown, many variations for providing tactile response or return of the keys to a predetermined position exist which could be used in conjunction with the integrated motherboard/keyboard/housing assembly. Further, while specific materials have been disclosed in many instances, alternative materials could be used with like results. While the preferred embodiment is to use the upper surface of the bottom of the main housing as a substrate for the keyboard circuit layer, substantial benefits in height and weight reduction can be achieved solely by integrating the motherboard and keyboard assemblies without using the upper surface of the bottom of the main housing as a substrate for the keyboard circuit layer. Similarly, if the motherboard could be designed so that it did not lie under the keyboard, a height and weight reduction could be achieved by using the upper surface of the bottom of the main housing as a substrate for the keyboard circuit layer, without integrating the keyboard and motherboard assemblies.

Although the Detailed Description of the invention directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A portable computer comprising:
   a circuit board containing processing circuitry and having a plurality of holes formed therein; and
   a plurality of keys disposed in said holes, said keys moving within said holes during a keystroke wherein said plurality of holes provide support to said keys to reduce lateral wobble.

2. The portable computer of claim 1 wherein said circuit board includes guides in each of said holes for providing smooth movement of the key within each hole using the circuit board for support of said guides.

3. The portable computer of claim 1 and further comprising a resilient member associated with each key for returning said key to a predetermined position after a keystroke.

4. The portable computer of claim 3 wherein said resilient member comprises a coiled spring.

5. The portable computer of claim 3 wherein said resilient member comprises a cup-shaped member formed of a resilient material.

6. The portable computer of claim 1 and further comprising a housing, said circuit board disposed within said housing.

7. The portable computer of claim 6 and further comprising a display coupled to said housing.

8. The portable computer of claim 6 wherein a portion of said housing is disposed below said keys to provide a rigid substrate for a keyboard circuit for determining which of said keys is pressed during a keystroke.

9. The portable computer of claim 8 wherein said keyboard circuit is formed on said portion of said housing.

10. The portable computer of claim 8 wherein said keyboard circuit is formed on a sheet of flexible material disposed above said portion of said housing.

11. The portable computer of claim 7 wherein said display folds toward said main housing for storage.

12. The portable computer of claim 11 wherein said display presses said keys downward when folded toward said main housing.

13. A portable computer comprising:

a circuit board containing processing circuitry and having a plurality of holes formed therein;

a plurality of keys disposed in said holes, said keys moving within said holes during a keystroke; and a housing for enclosing said circuit board and for supplying a rigid substrate upon which said keys press during keystrokes wherein said circuit board includes guides in each of said holes for providing smooth movement of the key within each hole.

14. The portable computer of claim 13 and further comprising a resilient member associated with each key for returning said key to a predetermined position after a keystroke.

15. The portable computer of claim 13 and further comprising a display coupled to said housing.

16. The portable computer of claim 13 wherein a portion of said housing is disposed below said keys to provide a rigid substrate for a keyboard circuit for determining which of said keys is pressed during a keystroke.

17. The portable computer of claim 16 wherein said keyboard circuit is formed on said portion of said housing.

18. The portable computer of claim 16 wherein said keyboard circuit is formed on a sheet of flexible material disposed above said portion of said housing.

19. The portable computer of claim 15 wherein said display folds toward said main housing for storage such that said keys are pressed downward when said display and said housing are in a closed position.

20. A method of manufacturing a portable computer, comprising the steps of:

disposing a plurality of keys through respective holes in a circuit board containing processing circuitry such that said keys move within said holes during a keystroke wherein said holes provide guide support to achieve anti-wobble of said keys; and enclosing said circuit board in a housing.

21. The method of claim 20 and further comprising the step of disposing guides in said holes between said circuit board and said keys using the circuit board for support of said guides.

22. The method of claim 20 and further comprising the step of disposing a resilient member between each key and said circuit board.

23. The method of claim 20 and further comprising the step of connecting said circuit board to a display.

24. The method of claim 20 and further comprising the step of forming a keyboard circuit on said housing for determining which of said keys is pressed during a keystroke.

* * * * *